United States Patent
Aal

(10) Patent No.: US 10,236,270 B2
(45) Date of Patent: Mar. 19, 2019

(54) INTERPOSER AND SEMICONDUCTOR MODULE FOR USE IN AUTOMOTIVE APPLICATIONS

(71) Applicant: VOLKSWAGEN AG, Wolfsburg (DE)

(72) Inventor: Andreas Aal, Braunschweig (DE)

(73) Assignee: VOLKSWAGEN AG (DE)

( * ) Notice: Subject to any disclaimer, the term of this patent is extended or adjusted under 35 U.S.C. 154(b) by 0 days.

(21) Appl. No.: 15/159,928

(22) Filed: May 20, 2016

(65) Prior Publication Data
US 2016/0343648 A1   Nov. 24, 2016

(30) Foreign Application Priority Data

May 22, 2015  (DE) .................. 10 2015 006 500
Oct. 7, 2015   (DE) .................. 10 2015 219 366

(51) Int. Cl.
| | |
|---|---|
| *H01L 23/495* | (2006.01) |
| *H01L 23/00* | (2006.01) |
| *H01L 23/14* | (2006.01) |
| *H01L 23/36* | (2006.01) |
| *H01L 23/31* | (2006.01) |

(52) U.S. Cl.
CPC ............ *H01L 24/29* (2013.01); *H01L 23/147* (2013.01); *H01L 23/3121* (2013.01); *H01L 23/36* (2013.01); *H01L 23/49531* (2013.01); *H01L 23/49575* (2013.01); *H01L 24/09* (2013.01)

(58) Field of Classification Search
CPC ....... H01L 24/09; H01L 24/29; H01L 23/147; H01L 23/3107; H01L 23/3675; H01L 23/3735; H01L 23/49811; H01L 23/49575

USPC .......................... 257/356, 675, 773; 438/109
See application file for complete search history.

(56) References Cited

U.S. PATENT DOCUMENTS

| | | | |
|---|---|---|---|
| 5,486,720 A | 1/1996 | Kierse | |
| 5,598,031 A | 1/1997 | Groover et al. | |
| 5,644,167 A | 7/1997 | Weiler et al. | |
| 6,603,072 B1* | 8/2003 | Foster ................. | H01L 25/0657 174/536 |
| 2004/0100772 A1* | 5/2004 | Chye ....................... | H01L 24/97 361/702 |
| 2007/0262387 A1 | 11/2007 | Nonaka et al. | |
| 2008/0093729 A1* | 4/2008 | Siepe .................. | H01L 23/3735 257/703 |

(Continued)

FOREIGN PATENT DOCUMENTS

| | | |
|---|---|---|
| DE | 102007046021 A1 | 5/2008 |
| DE | 102008026550 A1 | 12/2008 |

(Continued)

*Primary Examiner* — Dzung Tran
(74) *Attorney, Agent, or Firm* — Barnes & Thornburg LLP

(57) ABSTRACT

An interposer of silicon for use in a semiconductor module, wherein the interposer has a top side serving for arrangement of functional semiconductor and an underside and is subdivided into a connection layer and a thermal layer along a plane running between the top side and the underside. The connection layer forming the surface of the interposer has a network with contact pads arranged on the surface for connection of the functional semiconductors arranged on the surface of the interposer, while the thermal layer has no metallization, and the underside of the interposer formed by the thermal layer serves for dissipating the heat generated by the functional semiconductors.

16 Claims, 1 Drawing Sheet

(56) References Cited

U.S. PATENT DOCUMENTS

| | | | | |
|---|---|---|---|---|
| 2008/0142937 A1* | 6/2008 | Chen | .................... | H01L 23/4334 |
| | | | | 257/675 |
| 2008/0157321 A1* | 7/2008 | Camacho | ............ | H01L 21/6835 |
| | | | | 257/686 |
| 2011/0210444 A1* | 9/2011 | Jeng | ........................ | H01L 23/13 |
| | | | | 257/738 |
| 2011/0298121 A1* | 12/2011 | Nishibori | ................ | H01L 23/24 |
| | | | | 257/713 |
| 2014/0035114 A1* | 2/2014 | Gogoi | ................. | H01L 25/0652 |
| | | | | 257/676 |
| 2014/0210093 A1* | 7/2014 | Wang | ..................... | H01L 23/36 |
| | | | | 257/773 |

FOREIGN PATENT DOCUMENTS

| | | |
|---|---|---|
| DE | 102008040727 A1 | 1/2010 |
| DE | 102011076235 A1 | 2/2012 |
| DE | 112012005472 T2 | 9/2014 |
| KR | 0134647 B1 | 4/1998 |
| KR | 0729362 B1 | 6/2007 |
| KR | 20140086416 A | 7/2014 |

* cited by examiner

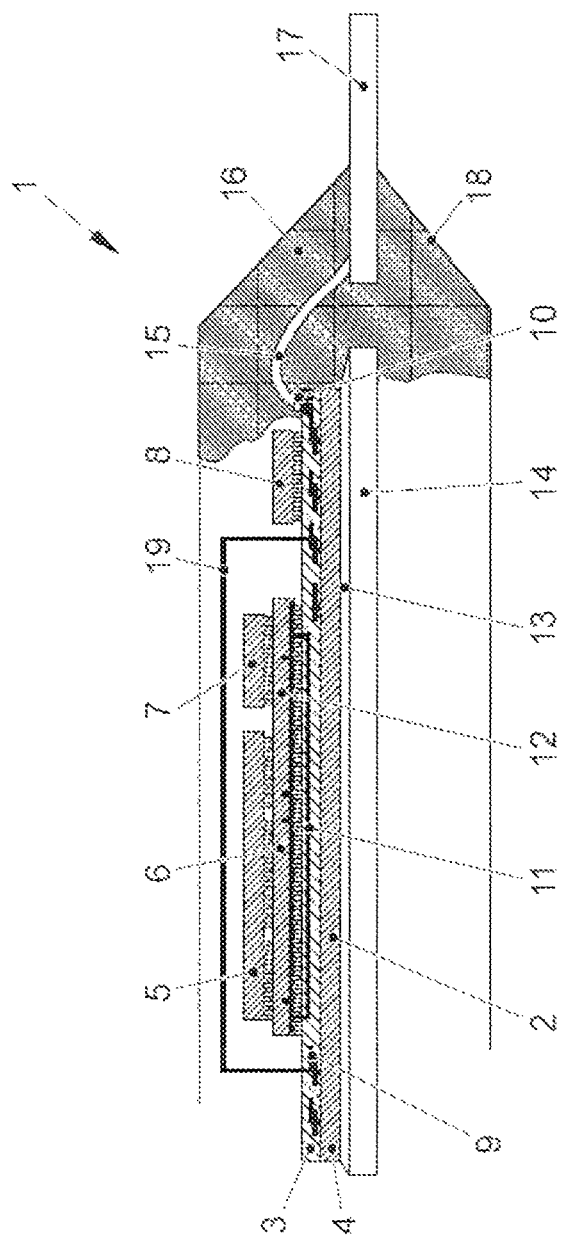

INTERPOSER AND SEMICONDUCTOR MODULE FOR USE IN AUTOMOTIVE APPLICATIONS

PRIORITY CLAIM

This patent application claims priority to German Patent Application Nos. 10 2015 006 500.9, filed 22 May 2015, and 10 2015 219 366.7, filed 7 Oct. 2015, the disclosures of which are incorporated herein by reference in their entirety.

SUMMARY

Illustrative embodiments relate to an interposer for use in a semiconductor module and to a semiconductor module with such an interposer for application in automotive applications.

BRIEF DESCRIPTION OF THE DRAWINGS

Disclosed embodiments are explained below with reference to the drawing, in which FIG. 1 shows a cross-sectional view of a semiconductor module with an interposer.

DETAILED DESCRIPTION

Integrated circuits contain a large number of active and passive semiconductor components that are of different types or are identical and also connecting conductor tracks on or in a monocrystalline substrate, usually silicon. In this case, the semiconductor components in the customary integrated circuits are usually arranged in a planar state, i.e., using a 2D technology. In the course of increasing miniaturization and the increase in the functional growth of such integrated circuits, the space requirement is rising in the case of a pure 2D arrangement despite reduction of the size of the components and conduction tracks, and so focus is increasingly shifting to 2.5D integrated circuits or 3D integrated circuits to increase the functional density.

A 3D integrated circuit is an integrated circuit which consists of a vertical stack of coordinated individual chips. From outside it appears like a monolithic circuit, but strictly speaking it is rather a hybrid circuit which is significantly more highly integrated than typical hybrid circuits. Overall, with this 3D integration the desired aim would be to achieve an even higher functionality of the integrated circuits with the package having the same basic area. Through hole plating with the aid of silicon vias, wherein the designation TSV (through-silicon via), has become established, connects the individual chip levels of a 3D integrated circuit. In this case, TSV in semiconductor technology is understood to mean a usually vertical electrical connection composed of metal through a silicon substrate, which results in an electrical connection between partial chips in 3D integration.

One variant as an alternative is silicon interposer technology as a so-called 2.5D integration method, in which the chips or chip stacks are arranged alongside one another on an interposer having a connection network including TSV for interconnecting the chips or the chip stacks. The background is the desire to be able to electrically connect semiconductor products of different technologies and manufacturers functionally to one another in a small space. The primary field of application is consumer electronics, here specifically mobile communication, or special applications placing extreme demands on the space requirement.

The properties of a silicon interposer according to the prior art are described briefly below. By using a standard CMOS fabrication process, such as 65 nm technology, for example, so-called BEOL (BEOL: backend-of-line) process steps are performed to produce a connection network in silicon by means of a metallization in a plurality of planes. The connection network ends in corresponding contact pads at the surfaces of the interposer. By means of the contact pads, different chips of different manufacturers and technologies, using customary contacting technologies, such as microbumps or copper pillars, for example, can be connected to corresponding contact structures of the functional semiconductors or the interposer itself can be connected to a generally organic carrier substrate. In this case, interposers integrate TSVs to enable a direct, space-saving through hole plating to the carrier substrate.

The known solutions aim to achieve a space-saving integration of a wide variety of functions, but they do not address the issue of different functional components being intelligently integrated with one another with a robustness-enhancing feature. In other words, the known solutions do not fulfill the necessary reliability and robustness requirements in motor vehicles.

For this reason, complex functions sold by way of volume products are in part not available for motor vehicle technology since corresponding interfaces of construction and connection technology are not compatible with those of the automotive processing chain.

With the use of previous solutions, technological weak points have to be compensated for by complex, intelligent system compensation solutions or failure-cushioning mechanisms. On account of the associated costs, this can currently be realized only to a limited extent in the vehicle premium segment.

Disclosed embodiments provide improved semiconductor modules for application in automotive applications. Disclosed embodiments also provide an interposer for use in a semiconductor module and a semiconductor module containing such an interposer. The disclosed interposer may be composed of silicon for use in a semiconductor module, wherein the interposer has a top side serving for arrangement of functional semiconductors and an underside, is subdivided into a connection layer and a thermal layer along a plane running between the top side and the underside. In this case, the connection layer forming the surface of the interposer has a network with contact pads arranged on the surface for connection of the functional semiconductors arranged on the surface of the interposer, while the thermal layer has no metallization whatsoever, and the underside of the interposer formed by the thermal layer serves for dissipating the heat generated by the functional semiconductors.

In this case, a functional semiconductor is defined as a semiconductor product having active functions, and an interposer is defined as a circuit carrier, wherein the interposer here is realized on the basis of silicon.

The disclosed interposer thus may contain no TSVs, which results in lower process costs, a reduced mechanical stress transmission, a reduction of the crack/tear probability in the direction of the contact interfaces with the functional semiconductors, such as the microbumps, for example. Furthermore, the disclosed interposer contains no contact pads on the underside, and the underside together with a die attach material and the die paddle serves as a thermal interface. In the case of semiconductor packages with exposed pads, this results in the reduction of temperature gradients on account of the good thermal conductivity of silicon and thus in lower loading for the interfaces of construction and connection technology in the entire construction.

Optionally, to improve the dissipation of the generated heat, the underside of the interposer formed by the thermal layer can have a metallization layer. In other words, a metallization layer can be applied on the thermal layer to improve the stability and the thermal conductivity of the interposer.

Optionally, contact pads connected to the network of the connection layer are arranged on the surface of the interposer, the contact pads serving for linking the interposer to package pins, i.e., external terminals. The linking is effected by means of customary wire bonding processes. Since the linking to the package pins is effected only by means of the mechanical stable interposer, the mechanically sensitive functional semiconductors are decoupled from the wire bonding processes.

The connection layer of the interposer may have ESD protection structures (ESD: Electrostatic Discharge) serving for connecting shields for the functional semiconductors on the top side of the interposer. Optionally arranged in proximity to the contact pads, these active ESD protection structures are integrated in the connection layer of the interposer, and they can be designed depending on the range of requirements. This results in the degree of freedom for a higher ESD strength even with the use of modern functional semiconductors which do not include such a capability owing to dictates of technology and space. This is important particularly for the dynamic ESD and latchup strength under regular vehicle operating conditions, which are becoming increasingly more important than the purely assembly-oriented conditions.

Further protection circuits may serve, for example, for handling overvoltage and/or overcurrent are integrated in the connection layer of the interposer. Together with the ESD protection structures, the interposer thus contains the character of a chip.

The disclosed semiconductor module for automotive use may comprise at least one interposer arranged on the die paddle, wherein at least one functional semiconductor is arranged on the surface of the interposer. The interposer explained above is used as interposer.

Optionally, the underside of the at least one interposer formed by the thermal layer is connected to the die paddle by means of a die attach material. As a result, a thermal interface for dissipating the heat generated by the functional semiconductors is provided on account of the good thermal conductivity of silicon.

At least one of the functional semiconductors may be arranged on the top side of the interposer is arranged in a shielding cap, wherein the shielding cap is connected to the ESD protection structure of the connection layer.

The electromagnetic emission from functional semiconductors at ever higher clocked frequencies and the irradiation sensitivity are playing an ever greater part in the automotive context. In the case of known solutions, this currently results in complex, costly and space-intensive EMC compensation measures (EMC: electromagnetic compatibility) at the PCB level (PCB: Printed Circuit Board).

The use of the proposed interposer makes it possible to design shields, for example, caps, over the functional semiconductors. This can be done, for example, by using semiconductors with a cavity region as known from MEMS fabrication (MEMS: microelectromechanical systems). In this case, in principle, a further interposer with TSVs in the edge region and continuous metal planes is produced and a cavity is provided in the center. Afterward, the interposer, in accordance with the flip-chip principle, is contacted by means of the contact interfaces of the main interposer, such that all or some of the functional semiconductors are enclosed. The corresponding contact network can then be used to carry out a linking to ground or signals which are routed completely around the functional semiconductors. A further side effect is that sensitive functional semiconductors can thus additionally also be protected against the external influence of the different mold compounds, in particular, filler materials.

Optionally, the semiconductor module is arranged in a molding compound, also referred to as mold compound. This brings about an additional protection of the interposer in the mold compound.

The semiconductor module may be connected to external terminals, i.e., package pins, by means of bond wires via the contact pads arranged on the top side of the interposer. In this way, forces exerted by the bond wires are kept away from the functional semiconductors.

The disclosed interposer technology provides external ESD protection structures as part of a semiconductor module without modification of standard solutions in the consumer functional semiconductor, which constitutes an inexpensive and safe solution against ESD events from the application. The disclosed interposer technology also provides functions which are necessary in the automobile and which are not concomitantly provided by a consumer functional semiconductor itself, by the modular integration of further functional semiconductors on the interposer. These include signal conditioners for assessing the plausibility of signals and supply stabilizers for stabilizing the supply in the case of overvoltage and undervoltage events and, if appropriate, additional ESD protection circuits. The disclosed interposer technology also decouples the thermomechanical force transmission between package and functional semiconductors and improves thermal coupling of different functional semiconductors (multi-chip package) for the reduction of temperature gradients in a package or module and a reduced parameter drift associated therewith. The disclosed interposer technology also decouples the wire bonding process by the bonding between interposer and leadframe of functional semiconductors, whereby mechanically sensitive structures are avoided and avoids various BGA (BGA: ball grid array) related failure modes, since the connections in the package are protected, particularly since solder ball and PCB are mechanically decoupled. The disclosed interposer technology also changes management with the use of consumer semiconductors in the case of frequent changes by virtue of avoidance or reduction of layout changes at the PCB level by primary change in the interposer wiring and is compatible with regard to the further use of traditional package designs including for innovative technologies. The disclosed interposer technology also simplifies the possibility of the additional integration of active/passive shielding covers with an improvement of the EMC behavior in a confined space, which also applies to RF components, is a space-saving transfer of various redundancy concepts from the system level to the semiconductor module level, and provides additional housing with a corresponding protection of the interposer in a mold compound.

The implementation of the concept described above makes it possible to achieve a significantly more reliable and more cost-effective integration of necessary functions from the consumer electronics sector into the automotive sector.

The semiconductor module 1 has an interposer 2 composed of silicon as central element, wherein the interposer 2 has a connection layer 3 forming the top side of the interposer 2 and a thermal layer 4 forming the underside of the interposer 2. Since the interposer 2 constitutes a planar structure whose thickness is significantly smaller than its width and length, the interposer is substantially defined by its top side and its underside. Considered formally, it is therefore possible to define a separating plane between the connection layer 3 and the thermal layer 4 which runs parallel to the top side and underside in the interior of the interposer 2.

Functional semiconductors 5, 6, 7 and 8 are arranged on the top side of the interposer 2, wherein the functional semiconductors 5 and 7 are arranged on the functional semiconductor 6 and the connection between the functional semiconductors 5, 6 and 7 is produced, for example, by means of μbumps 12.

The connection layer 3 has a network 11 which produces the connection between those functional semiconductors 6 and 8 which are arranged directly on the top side of the interposer 2, wherein the connection of these functional semiconductors 6 and 7 to the network 11 is brought about, for example, by means of a BGA (Ball Grid Array).

The connections between external terminals 17 of the semiconductor module 1 and the network 11 of the connection layer 3 are produced by means of contact pads 10 which are arranged exclusively on the surface of the interposer 2 and by means of which the connection between the external terminals 17 and the network 11 is effected by means of bond wires 15 in a customary manner.

Furthermore, correspondingly active ESD protection structures 9 are integrated in the connection layer 3, and they can be designed depending on the requirement range. This results in the degree of freedom for a higher ESD strength even with the use of modern functional semiconductors which do not include such a capability owing to dictates of technology and space. This is important particularly for the dynamic ESD and latchup strength under regular vehicle operating conditions, which are becoming increasingly more important than the purely assembly-oriented conditions.

Since the electromagnetic emission of the functional semiconductors 5, 6, 7, 8 at ever higher clocked frequencies and the irradiation sensitivity are playing an ever greater part, the interposer 2 has the possibility of designing a shield 19, for example, a cap, for example, over the corresponding functional semiconductors 5, 6 and 7. The network 11 of the connection layer 3 of the interposer 2 can then be used to perform a linking to ground or signals which are routed completely around the functional semiconductors 5, 6, 7.

A further side effect is that sensitive functional semiconductors 5, 6, 7 can thus additionally also be protected against the external influence of different mold compounds 16, in particular, filler materials.

To achieve an unimpeded heat dissipation of the waste heat of the functional semiconductors 5, 6, 7 and 8, the thermal layer 4 of the interposer has no metallization components. In other words, the thermal layer 4 of the interposer 2 is free of metal and has no networks or TSVs whatsoever. The thermal layer 4 of the silicon interposer 2 is connected to the die paddle 14 by means of a die attach 13 to bring about the heat transport.

To achieve an improvement in heat conduction and an increase in stability, the thermal layer 4 on the underside of the interposer 2 can be provided with a metallization layer (not illustrated) such that the die attach 13 connects the metallization layer arranged on the thermal layer 4 to the die paddle 14.

The semiconductor module 1 with the interposer 2, the die paddle 14, the functional semiconductors 5, 6, 7, 8 arranged on the interposer, the shield 19, the bond wires and the external terminals 17 is arranged in a customary manner in a package 18 composed of a mold compound 16.

Integrated circuits contain a large number of active and passive semiconductor components that are of different types or are identical and also connecting conductor tracks on or in a monocrystalline substrate, usually silicon. In this case, the semiconductor components in the customary integrated circuits are usually arranged in a planar state, i.e., using a 2D technology. In the course of increasing miniaturization and the increase in the functional growth of such integrated circuits, the space requirement is rising in the case of a pure 2D arrangement despite reduction of the size of the components and conduction tracks, and so focus is increasingly shifting to 2.5D integrated circuits or 3D integrated circuits to increase the functional density.

A 3D integrated circuit is an integrated circuit which consists of a vertical stack of coordinated individual chips. From outside it appears like a monolithic circuit, but strictly speaking it is rather a hybrid circuit which is significantly more highly integrated than typical hybrid circuits. Overall, with this 3D integration the desired aim would be to achieve an even higher functionality of the integrated circuits with the package having the same basic area. Through hole plating with the aid of silicon vias, wherein the designation TSV (through-silicon via), has become established, connects the individual chip levels of a 3D integrated circuit. In this case, TSV in semiconductor technology is understood to mean a usually vertical electrical connection composed of metal through a silicon substrate, which results in an electrical connection between partial chips in 3D integration.

One variant as an alternative is silicon interposer technology as a so-called 2.5D integration method, in which the chips or chip stacks are arranged alongside one another on an interposer having a connection network including TSV for interconnecting the chips or the chip stacks. The background is the desire to be able to electrically connect semiconductor products of different technologies and manufacturers functionally to one another in a small space. The primary field of application is consumer electronics, here specifically mobile communication, or special applications placing extreme demands on the space requirement.

The properties of a silicon interposer according to the prior art are described briefly below. By using a standard CMOS fabrication process, such as 65 nm technology, for example, so-called BEOL (BEOL: backend-of-line) process steps are performed to produce a connection network in silicon by means of a metallization in a plurality of planes. The connection network ends in corresponding contact pads at the surfaces of the interposer. By means of the contact pads, different chips of different manufacturers and technologies, using customary contacting technologies, such as microbumps or copper pillars, for example, can be connected to corresponding contact structures of the functional semiconductors or the interposer itself can be connected to a generally organic carrier substrate. In this case, interposers integrate TSVs to enable a direct, space-saving through hole plating to the carrier substrate.

The document DE 10 2007 046 021 A1 discloses a semiconductor arrangement comprising a silicon body having a first surface and a second surface, wherein a thick metal layer of at least 10 μm is arranged on at least one of the surfaces of the silicon body, wherein the thick metal layer serves for bonding thick bond wires.

The document US 20070262387 A1 describes a semiconductor module for use in an automotive application. In this case, the semiconductor module comprises a three-layered integral printed circuit board consisting of a metal substrate electrode, an insulation substrate and a heat sink, which are uniformly connected by soldering, and a semiconductor power device, which is connected to a top side of the metal substrate electrode of the printed circuit board.

LIST OF REFERENCE SIGNS

1 Semiconductor module
2 Interposer
3 Connection layer of interposer
4 Thermal layer of interposer
5 Functional semiconductor
6 Functional semiconductor
7 Functional semiconductor
8 Functional semiconductor
9 ESD protection structure
10 Contact pad
11 Network
12 μbumps
13 Die attach
14 Die paddle
15 Bond wire
16 Mold compound
17 External terminal
18 Package
19 Shield

The invention claimed is:

1. An interposer composed of silicon for use in a semiconductor module, the interposer comprising:
a top side;
an underside;
a connection layer; and
a metal-less thermal layer,
wherein each of the connection layer and the thermal layer are positioned in planes running between the top side and the underside,
wherein the connection layer forms a surface of the interposer that includes a network with contact pads arranged on the surface of the top side for connection of functional semiconductors arranged on the top side of the interposer, wherein at least one ESD protection structure is integrated in the connection layer serving for connecting shields for the functional semiconductors on the top side of the interposer,
wherein the underside of the interposer formed by the thermal layer dissipates heat generated by the functional semiconductors, and
wherein at least one of the functional semiconductors is arranged on the surface of the top side of the interposer and another one of the functional semiconductors is arranged on top of the at least one of the functional semiconductors.

2. The interposer of claim 1, wherein the contact pads of the connection layer are arranged on the surface of the interposer, the contact pads serving for linking the interposer to external terminals.

3. The interposer of claim 1, further comprising a metallization layer formed on the underside of the thermal layer that facilitates heat conduction.

4. A semiconductor module for automotive use with at least one interposer arranged on a semiconductor chip, wherein at least one functional semiconductor is arranged on the surface of the at least one interposer, wherein the at least one interposer comprises:
a top side;
an underside;
a connection layer; and
a metal-less thermal layer,
wherein each of the connection layer and the thermal layer are positioned in planes running between the top side and the underside,
wherein the connection layer forms a surface of the interposer that includes a network with contact pads arranged on the surface of the top side for connection of functional semiconductors arranged on the top side of the interposer, wherein the connection layer includes at least one ESD protection structure integrated therein serving for connecting shields for the functional semiconductors on the top side of the interposer,
wherein the underside of the interposer formed by the thermal layer dissipates heat generated by the functional semiconductors, and
wherein at least one of the functional semiconductors is arranged on the top side and another one of the functional semiconductors is arranged on top of the at least one of the functional semiconductors.

5. The semiconductor module of claim 4, wherein the contact pads of the connection layer are arranged on the surface of the interposer, the contact pads serving for linking the interposer to external terminals.

6. The semiconductor module of claim 4, further comprising a metallization layer formed on the underside of the thermal layer that facilitates heat conduction.

7. The semiconductor module of claim 4, wherein the underside of the at least one interposer formed by the thermal layer is connected to a die paddle by a die attach material.

8. The semiconductor module of claim 4, wherein at least one of the functional semiconductors arranged on the top side of the at least one interposer is arranged in a shielding cap, wherein the shielding cap is connected to the at least one ESD protection structure of the connection layer.

9. The semiconductor module of claim 4, wherein the semiconductor module is arranged in a molding compound forming a package.

10. The semiconductor module of claim 4, wherein the semiconductor module is connected to external terminals by bond wires via contact pads arranged on the top side of the interposer.

11. The semiconductor module of claim 4, wherein the network is at least partly embedded within the connection layer.

12. The semiconductor module of claim 1, wherein the network is at least partly embedded within the connection layer.

13. A semiconductor module for automotive use with at least one interposer arranged on a semiconductor chip, wherein at least one functional semiconductor is arranged on the surface of the at least one interposer, wherein the at least one interposer comprises:
a top side;
an underside;
a connection layer forming a surface of the interposer; and
a metal-less thermal layer,
wherein each of the connection layer and the thermal layer are arranged between the top side and the underside,
wherein the connection layer includes a network at least partly embedded therein and having contact pads arranged on the surface of the top side for connection of functional semiconductors arranged on the top side of the interposer, and at least one ESD protection circuit integrated therein serving for connecting shields for the functional semiconductors on the top side of the interposer, wherein the underside of the interposer formed by the thermal layer dissipates heat generated by the functional semiconductors, and wherein at least one of the functional semiconductors is arranged on top of another one of the functional semiconductors, the at least one of the functional semiconductors arranged on the top side, and the network connects with the another one of the functional semiconductors.

14. The semiconductor module of claim 4, wherein the network connects with the another one of the functional semiconductors.

15. The semiconductor module of claim 12, wherein the network connects with the another one of the functional semiconductors.

16. The interposer of claim 1, wherein the at least one protection structures serve for handling overvoltage and/or overcurrent.

* * * * *